United States Patent [19]

Clark et al.

[11] Patent Number: 5,208,069

[45] Date of Patent: May 4, 1993

[54] METHOD FOR PASSIVATING THE INNER SURFACE BY DEPOSITION OF A CERAMIC COATING OF AN APPARATUS SUBJECT TO COKING, APPARATUS PREPARED THEREBY, AND METHOD OF UTILIZING APPARATUS PREPARED THEREBY

[75] Inventors: Terence J. Clark; Michael J. Hanagan, both of Princeton; Richard W. Cruse, Kendall Park; Veronika A. Szalai, Rocky Hill; Stephen J. Rohman, Plainsboro; Robert M. Mininni, Skillman, all of N.J.

[73] Assignees: Istituto Guido Donegani S.p.A.; Enichem S.p.A., Milan, Italy

[21] Appl. No.: 783,264

[22] Filed: Oct. 28, 1991

[51] Int. Cl.$^5$ ............................................. B05D 3/02
[52] U.S. Cl. ...................................... 427/226; 427/237; 427/239; 427/249; 427/255
[58] Field of Search ............... 427/237, 239, 255, 249, 427/226

[56] References Cited

U.S. PATENT DOCUMENTS

| | | | |
|---|---|---|---|
| 1,234,886 | 7/1917 | Eldred et al. | |
| 2,580,002 | 12/1951 | Carrier | 260/683 |
| 3,536,776 | 10/1970 | Lo | 260/683 |
| 3,746,569 | 7/1973 | Pammer et al. | 427/237 |
| 3,781,173 | 12/1973 | Napier et al. | 427/237 |
| 3,796,592 | 3/1974 | Cohen et al. | 427/237 |
| 4,099,990 | 7/1978 | Brown et al. | 148/6.35 |
| 4,371,944 | 2/1983 | Stewart et al. | 364/502 |
| 4,780,196 | 10/1988 | Alagy et al. | 208/130 |
| 4,906,442 | 3/1990 | Johnson et al. | 422/183 |
| 4,999,228 | 3/1991 | Matsumoto et al. | 427/237 |

FOREIGN PATENT DOCUMENTS 1332569 10/1973 United Kingdom .

OTHER PUBLICATIONS

Chambers et al., Hydrocarbon Processing, Jan. 1974, pp. 121–126.

Kirk-Othmer, Encyclopedia of Chemical Technology, 3rd Ed., Wiley & Sons, vol. 9, pp. 393, 400–408, and 426–431, (1980).

Primary Examiner—Janyce Bell
Attorney, Agent, or Firm—Oblon, Spivak, McClelland, Maier & Neustadt

[57] ABSTRACT

In order to reduce the rate of coke formation during the industrial pyrolysis of hydrocarbons, the interior surface of the reactor tubes are coated with a thin layer of a ceramic material, said layer being deposited by thermal decomposition of a non-oxygen containing silicon organometallic precursor in the vapor phase, in an inert or reducing gas atmosphere in order to minimize the formation of oxide ceramics.

13 Claims, No Drawings

METHOD FOR PASSIVATING THE INNER SURFACE BY DEPOSITION OF A CERAMIC COATING OF AN APPARATUS SUBJECT TO COKING, APPARATUS PREPARED THEREBY, AND METHOD OF UTILIZING APPARATUS PREPARED THEREBY

BACKGROUND OF THE INVENTION

1. Field of the Invention

The present invention relates to a method for passivating the interior of reactors which are subject to coking, such as hydrocarbon pyrolysis tubes, in order to reduce the rate of coke formation, in particular during the production of ethylene. The invention relates both to conventional ethylene production which uses steam in the feedstock as a diluent and to nonconventional production which employs steamless cracking of feedstock. The present invention also relates to an improved apparatus exhibiting a reduced tendency to undergo coking produced by such a method and a method for pyrolyzing hydrocarbons utilizing such an apparatus.

2. Discussion of the Background

Coking is a significant problem in high-temperature chemical reactions, such as the pyrolysis of hydrocarbons, particularly in the production of ethylene.

Ethylene, the lightest olefinic hydrocarbon, is the most important building block of the petrochemical industry. Ethylene is produced almost exclusively via the pyrolysis of hydrocarbons in tubular reactor coils which are externally heated by a furnace (see: Chapter 8 in *Pyrolysis of Hydrocarbons*, p.109-142, Marcel Dekker Inc., New York (1980)). High selectivity toward the production of desired olefins (i.e., ethylene and propylene) and diolefins (i.e., butadiene) with minimum methane and hydrogen production and coking in the coils leading to longer heater runs are desired. This is achieved by operating the pyrolysis heaters at high temperatures (750-900° C.), short residence times (0.1-0.6 sec.) and low hydrocarbon partial pressures. Steam is added to the feedstock to reduce the hydrocarbon partial pressure and the amount of carbon deposited on the tube walls.

Steamless cracking has been investigated as a potential means of increasing production capacity and maximizing energy efficiencies (see "Steamless Pyrolysis of Ethane to Ethylene", Paper 101, presented at a meeting of the American Chemical Society, Boston, Mass., April 1990, by Y. Song, A. A. Leff, W. R. Kliewer and J. E. Metcalf). The work cited above was performed in a tube made entirely of silicon carbide. The use of tubes constructed of silicon carbide, however, would not be possible on an industrial scale because of the low mechanical reliability and fabrication problems of this material.

Tubular reactor coils, also known as pyrolysis heaters, are an important facet of operation to consider partly because of coke deposition (see: *Kirk-Othmer Encyclopedia of Chemical Technology*, Vol. 9, "Ethylene", J. Wiley & Sons Inc., New York (1979)). The mechanism of coke formation has been postulated (see L. F. Albright & J. C. Marck, *Ind. Eng. Chem. Res.*, vol 27, 731 and 743 (1988)), but has yet to be modeled in precise terms.

The reduction of the coking rate and the extension of the reactor run time have been the subject of several investigations and commercial applications (see for example the Products Bulletins G-262, G-5263, G-5267, G-5268 by Nalco Chem. Co., Petroleum and Process Chemical Division, 1800 Eperson Bldn.—Houston, Tex.).

For instance, the use of a silicon dioxide layer to inhibit coke formation inside thermal cracking reactors is known from UK-1,332,569 and U.S. Pat. No. 4,099,990. In particular, in U.S. Pat. No. 4,099,990, the silicon dioxide coating is obtained by thermal decomposition of an alkoxysilane in the vapor phase. The silicon dioxide coating reduces coking rates. Although any non-catalytic surface would be effective for coke reduction the factors which determine industrial applicability of a coating material are the following: the thermal expansion match of the layer with the metal, the melting point of the coating material, the degree of strength, brittleness, adherence, the resistance to wear and corrosion, and so on. From this point of view, silicon dioxide films suffer from many drawbacks, mainly due to the wide gap between the thermal expansion coefficients of silicon dioxide and of the metal substrate. This mismatch causes poor adhesion of the layer to the substrate, poor thermal shock and spallation resistance.

U.S. Pat. No. 3,536,776 discloses a method of reducing coke in the high temperature conversion of hydrocarbons by utilizing a reactor which is coated with a metal ceramic material containing particles of a catalytically inert, refractory solid ceramic substance dispersed in chromium.

Thus, there remains a need for an apparatus which exhibits a reduced tendency to undergo coking. In particular, there remains a need for a method and an apparatus for pyrolyzing hydrocarbons which are free of the above-described drawbacks. There also remains a need for a method for producing such an apparatus.

SUMMARY OF THE INVENTION

Accordingly, it is an object of the present invention to provide a novel apparatus which exhibits a reduced tendency to undergo coking.

It is another object of the present invention to provide a novel apparatus for the pyrolysis of hydrocarbons which minimizes the coking rate.

It is another object of the present invention to provide a method for preparing such an apparatus.

It is another object of the present invention to provide a method of pyrolyzing hydrocarbons utilizing such an apparatus.

These and other objects, which will become apparent during the following detailed description, have been achieved by the inventors' discovery that the reduction of the coking rate in reactors which are subject to coking can be achieved by the controlled deposition, on the inner surface of the reactor cracker tubes, of a coating derived from a silicon organometallic precursor, in an inert or reducing gas atmosphere in order to limit the formation of oxide ceramics.

DETAILED DESCRIPTION OF THE PREFERRED EMBODIMENTS

Accordingly, in one embodiment, the present invention relates to a method for passivating the inner surface of reactor tubes which are subject to coking, wherein said surface is coated with a thin layer of a ceramic material, said layer being deposited by thermal decomposition of a silicon containing precursor in the vapor phase, in a controlled inert or reducing gas atmosphere in order to minimize the formation of oxide ceramics.

The thus-obtained ceramic material consists essentially of silicon carbide, silicon nitride, silicon carbonitride or mixtures thereof. Minor amounts of silicon dioxide, silicon oxycarbide or silicon oxynitride may form during the deposition without impairing the effectiveness of the layer. Thus, the mole fraction of oxygen incorporated in the ceramic layer is suitably 0 to 20 mol. %, preferably 0 to 10 mol. %. Moreover, free carbon may be present in the ceramic composition, derived from "excess" carbon based on stoichiometry considerations. The amount of free carbon is suitably 0 to 30 mol. %, preferably 0 to 20 mol. %. Additionally, up to 10 mol. % of other inert materials derived from the precursors or the gas carrier may be incorporated in the coating without detrimental effects.

The principal advantage deriving from the so called Chemical Vapor Deposition (CVD) of thin films (see *Vapor Deposition*, Eds. C. F. Powell, J. H. Oxley, J. M. Blocher Jr., J.Wiley & Sons, N.Y. (1966)), is the atom-by-atom nature of the deposition process which eliminates outgassing problems. This process often results in high film quality.

The choice of the organometallic molecular species that are likely to serve as efficient CVD precursors is dependent on a variety of factors. The choice of the molecular precursor must take into account such factors as the physical properties, ease of synthesis and handling, and the conditions required for thermolysis of the precursor in order to make coatings of suitable quality.

Silicon containing precursors suitable for the present invention are selected from silicon compounds which are volatile at temperatures below the deposition process. Typically, but not exclusively, these compounds will contain one or more silicon atoms with the other atoms being carbon, nitrogen, or hydrogen. These compounds may also contain other elements, such as chlorine or oxygen. Carbon can be readily supplied from the precursor but may also be supplied from the carrier gas, allowing the use of carbon-free silicon compounds as precursors. For example, a mixture of $H_xSiCl_{4-x}$ ($x=0$ to 4) and $CH_4$ can be used.

The flexibility in kinetics and decomposition mechanisms of silicon compounds affords deposition control along the length of heated tubing.

Thus, the preferred precursors are characterized by the following requirements. They possess a source of silicon atoms, X, and a source of carbon atoms, Y, and optionally a source of nitrogen atoms, Z, with the proviso that the remaining atoms are not incorporated in major amounts in the resulting ceramic layer. It is to be understood that the sources, X, Y, and Z may be provided either by different compounds or the same compound.

Silicon compounds suitable as precursors for the method of the present invention are listed below:
hexamethyldisilazane, tetramethylsilane,
(diethylamino)trimethylsilane,
(isopropylamino)trimethylsilane,
(dimethylamino)trimethylsilane, heptamethyldisilazane,
bis(isopropylamino)dimethylsilane, hexamethyldisilane,
tetramethyldisilazane, (diethylamino)triethylsilane,
tetrakis(dimethylamino)silane, bis(dimethylamino)methylsilane,
(dimethylamino)triethylsilane, trimethylsilane,
(dimethylamino)benzyldimethylsilane,
(dimethylamino)phenylmethylsilane,
(2-picolylamino)trimethylsilane,
tris(isopropylamino)methylsilane, dimethylsilane,
bis(diethylamino)methylsilane,
(dimethylamino)benzylmethylsilane, butylmethylphenylsilane,
(diisopropylamino)methylchlorosilane, octamethyltrisilazane,
bis(dimethylamino)phenylsilane, benzylmethylchlorosilane,
triisopropylsilane, tris(dimethylamino)methylsilane,
diethylmethylsilane, triethylsilane,
bis(dimethylamino)ethylsilane, hexamethyltrisilazane, and
(dimethylamino)dimethylsilane.

Mixtures of different organometallic compounds may also be suitably used.

The method of coating according to the present invention is carried out by simply heating an silicon containing compound in a controlled inert or reducing gas atmosphere, i.e., under conditions which minimize the formation of oxide ceramics, thereby obtaining certain advantages in that the stoichiometry of the ceramics is controllable. It is possible that the ceramics' physical properties (i.e., thermal expansion and strength) can be influenced.

For this purpose, carrier gases which are inert or reducing under the reaction conditions, such as nitrogen, argon, helium, methane, ethylene, ethane, hydrogen and mixtures thereof are suitable. Minor amounts of oxygen or oxygen-containing gases, such as carbon dioxide and monoxide, do not impair the properties of the obtained coating.

The concentration of the precursor in the carrier gas must be adjusted so as to avoid the formation of powders. The optimum concentration thus depends on the identity of the precursor and on the operative conditions. In general the concentration is suitably less than 10.0% v/v, preferably less than 5.0% v/v.

The deposition is generally carried out at atmospheric or slightly subatmospheric pressure.

Because the decomposition kinetics are different for different precursors, the temperature of deposition can vary from 600 to 1000° C., preferably 700 to 900° C. Decomposition kinetics are directly responsible for the deposition behavior observed. It is important to note that limitations to deposition temperature are mainly imposed by engineering technical reasons: for example, the upper temperature limit for precursor deposition is determined by the upper temperature limit of the furnace. The freedom to choose among precursors possessing different decomposition characteristics affords the opportunity to accommodate the limitations of the apparatus. Through adjusting flow rate of carrier gas, it is possible to control the movement of the maximum deposition zone within the tube length from tube inlet to tube outlet.

The desired thickness of the ceramic coating should be such to provide complete or near coverage of the tube inside surface. The thickness required for having an effective coating depends on the surface of the tube. The local thickness can be affected by surface roughness. Typically, coatings of 1 to 20 μm are used.

Thus, the present invention is characterized by the following advantages and features:

(1) The ceramic coating retards the formation of coke deposits by the passivation of the catalytically active metal surfaces which are present in tubular reactor coils in steam or steamless hydrocarbon pyrolysis reactors. A first consequence is an increase in productivity of ethylene, since the reduction in coking rate increases the duration between decoking cycles.

(2) Significant operation cost savings are realized since the decrease in the rate of coke formation also decreases the amount of energy required in the form of heat and therefore less fuel is consumed.

(3) The presence of the passivation layer may upgrade the carburization resistance of the steam cracker alloy tubing, resulting in a cost savings from less frequent tube replacements.

(4) With respect to the known methods where silicon dioxide is used, a significant improvement in the match of thermal expansion coefficients between the ceramic coating presented herein and the alloy steel heating tubes produces an increase in the operative life of the coating itself.

(5) Another advantage of in-situ silicon containing chemical vapor deposition is that more coating can be applied if and when coating failure occurs.

It is to be understood that, although the present method is particularly well suited for the coating of apparatus used in the pyrolysis of hydrocarbons, particularly in the production of ethylene, the present method may be beneficially applied to any apparatus which is subject to coking.

In another embodiment, the present invention relates to apparatuses which are subject to coking. In particular, the present apparatuses possess at least one reactor tube of which a surface is coated with a layer of a ceramic material consisting essentially of silicon carbide, silicon nitride, silicon carbonitride or mixtures thereof. Minor amounts of silicon dioxide, silicon oxycarbide or silicon oxynitride may form during the deposition without impairing the effectiveness of the layer. Thus, the mole fraction of oxygen incorporated in the ceramic layer is suitably 0 to 20 mol. %, preferably 0 to 10 mol. %. The amount of free carbon is suitably 0 to 30 mol. %, preferably 0 to 20 mol. %.

A general discussion of apparatuses used for the pyrolysis of hydrocarbons is given in *Kirk-Othmer Encyclopedia of Chemical Technology*, vol. 9, "Ethylene", pp 393–431, Wiley N.Y. (1980), which is incorporated herein by reference. A discussion of the apparatus and reaction condition parameters to be considered when maximizing the production of ethylene in hydrocarbon pyrolysis is provided in *L.E. Chambers et al, Hydrocarbon Processing*, January 1974, pp. 121–126, which is also incorporated herein by reference.

It is preferred that the present apparatus be for the pyrolysis of hydrocarbons. It is particularly preferred that the present apparatus be for the steam or steamless production of ethylene by cracking.

In a third embodiment, the present invention relates to a method of pyrolyzing a hydrocarbon by utilizing a reactor in which the inner surface is coated with a layer of a ceramic material consisting essentially of silicon carbide, silicon nitride, silicon carbonitride or mixtures thereof. Minor amounts of silicon dioxide, silicon oxycarbide or silicon oxynitride may form during the deposition without impairing the effectiveness of the layer. Thus, the mole fraction of oxygen incorporated in the ceramic layer is suitably 0 to 20 mol. %, preferably 0 to 10 mol. %. The amount of free carbon is suitably 0 to 30 mol. %, preferably 0 to 20 mol. %.

As noted above, a general discussion of the pyrolysis of hydrocarbon is provided in *Kirk-Othmer Encyclopedia of Chemical Technology*, vol. 9, pp. 393–431, Wiley, N.Y. (1980), which is incorporated herein by reference.

Thus, the present method of pyrolysis may utilize a variety of feedstocks such as ethane, propane, or multicomponent hydrocarbon feedstocks (e.g., natural gas liquids, naphthas, and gas oils). The particular conditions utilized, such as temperature, pressure, residence time, flow rate, etc., will depend on the particular geometry and characteristics of the reactor and identity of the feedstock being used. Selection of the appropriate reaction conditions is within the abilities of one having ordinary skill in this art. Preferably, the present method for pyrolyzing hydrocarbons is either the steam or steamless production of ethylene.

Having generally described this invention, a further understanding can be obtained by reference to certain specific examples which are provided herein for purposes of illustration only and are not intended to be limiting unless otherwise specified.

EXAMPLE 1

A general description for depositing a coating is as follows:

The silicon containing precursor hexamethyldisilazane (HMDS) was obtained from Petrarch Systems, Bristol, PA 19007, of purity 98%, with a boiling point of 126° C. By direct measurement, it was found if a gas was sparged through the liquid HMDS at room temperature and flow rates less than about 500 cc/min, the concentration of the HMDS in the exit gas is 2.2% v/v. The carrier gas was argon and the flow was controlled by a mass flow controller obtained from Tylan Corp., Carson, Cal. All connections between the bubbler and the cylinder regulators were sealed to ensure that no oxygen or water entered the supply lines and to cause undesirable side reactions.

The isothermal furnace used meter long quartz tubing in order to visually inspect the deposition zone and nature of the ceramic. The furnace was controlled such that a temperature of operation existed above that of the decomposition temperature of HMDS ($>720°$ C.).

HMDS/carrier gas was passed through the tubing (220 cc/min for 10 minutes). The result was a black, adherent coating, that microscopic observation revealed to be smooth and continuous. The thickness of the coating was determined to be 2 to 12 $\mu$m. A section of tubing, associated with the decomposition, was observed to be darkest in a location where the temperature in the gradient furnace had been held at 720° C. or more. This deposition zone is dependent on the rate of injection, flow rate (residence time) and/or the temperature. Using these variables it is possible to coat the full length of a tube.

EXAMPLE 2

The experiment was conducted in the same reactor described in Example 1. In this case, the silicon containing precursor (dimethylamino)triethylsilane was used. This precursor was obtained via laboratory synthesis of the compound.

(Dimethylamino)triethylsilane/carrier gas was passed through tubing (134.2 cc/min for 1.87 hours). The result was a black, adherent coating, that microscopic observation revealed to be smooth and continuous. The thickness of the coating was determined to be 1 to 17 $\mu$m.

EXAMPLE 3

The experiment was conducted in the same reactor described in Example 1. In this case, the organometallic precursor octamethyltrisilazane was used. This precursor was obtained via laboratory synthesis of the compound.

Octamethyltrisilazane/carrier gas was passed through tubing (42 cc/min for 6.2 hours). The result was a black, adherent coating, that microscopic observation revealed to be smooth and continuous. The thickness of the coating was determined to be 2 to 17 μm.

EXAMPLE 4

The experiment was conducted in the same reactor described in Example 1. In this case, the organometallic precursor bis(dimethylamino)methylsilane was used. This precursor was obtained via laboratory synthesis of the compound.

Bis(dimethylamino)methylsilane/carrier gas was passed through tubing (42 cc/min for 6.2 hours). The result was a black, adherent coating, that microscopic observation revealed to be smooth and continuous. The thickness of the coating was determined to be 3 to 19 μm.

EXAMPLE 5

To test the coke mitigating ability of the above ceramic coating, test coupons of 1 inch × ¼ inch × 1/16 inch in size were cut from substrates of 304 stainless steel. The coupons were inserted into the quartz tube furnace and coated according to the conditions of Example 1. Part of the coating was removed to expose the underlying metal surface. All coupons were then inserted into a stainless steel tube in an ethylene steam cracking reactor and subjected to rapid coking conditions. Coking of the exposed sections of coupons was observed while no significant coking occurred on the coated coupon sections.

EXAMPLE 6

A comparative study was made of the amount of coke formed in oxidized Incoloy-800 tubing versus ceramic coated Incoloy-800 tubing. Cracking experiments were performed using 0.375" OD×0.305" ID tubing with a heated length of approximately 150 cm. The ceramic coated tube was prepared by the method described in Example 1. The uncoated tube was oxidized overnight at 850° C. in flowing air. The conditions of cracking were: butane/steam ratio of 60/40 (vol.%) with a residence time of 0.75 seconds at 850° C. for 6 hours. The increase in weight resulting from the cracking operation was found to be only 75 mg for the coated tube but 400 mg for the uncoated tube. This difference took into account the pretest weight gains: from the ceramic coating in the case of the coated tube (approximately 75 mg), and from oxidation of the metal in the case of the uncoated tube (approximately 10 mg). Therefore the ceramic coating reduced the coking rate more than five times with respect to the uncoated tube.

EXAMPLE 7

A steamless ethane cracking experiment was performed to compare coated and uncoated tubes with respect to coking and the influence on product yield or effluent. Two experiments were conducted at 850° C. using ethane as the feedstock with a residence time of 0.37 seconds and total run tim=of 3 hours. The first experiment was performed in an Incoloy-800 tube which was coated with the ceramic layer according to the method of Example 1. The coated tube showed no measurable mass gain after correcting for oxidation of the outer tube surface and the mass of the ceramic layer. The second experiment was done in an oxidized Incoloy-800 tube. The oxidized tube showed a mass gain due to coke of 3 grams. This amount of coke represents approximately 0.2 mole percent of the ethane feedstock.

During pyrolysis the effluent composition was monitored by gas chromatography for: ethylene ($C_2H_4$), ethane ($C_2H_6$), propylene ($C_3H_6$), methane ($CH_4$), acetylene ($C_2H_2$), 1,3-butadiene ($C_4H_6$), carbon monoxide (CO) and carbon dioxide ($CO_2$). Hydrogen was determined by difference. Both effluents from the two experiments were very similar as shown below in Table I. In addition, the effluent compositions remained nearly constant with time over the duration of the experiment.

TABLE I

Average Effluent Composition for Steamless Pyrolysis of Ethane.

| Effluent Component | Ceramic Coated Tube | Oxidized Incoloy Tube |
|---|---|---|
| Ethylene | 30.3 (vol. %) | 29.4 (vol. %) |
| Ethane | 33.7 | 37.1 |
| Hydrogen | 33.5 | 30.9 |
| Methane | 0.8 | 2.0 |
| Acetylene | 0.1 | 0.1 |
| Propylene | 0.4 | 0.3 |
| 1,3-Butadiene | 0.3 | 0.3 |
| Carbon monoxide | 0.5 | 0.0 |
| Carbon dioxide | 0.5 | 0.1 |

These results indicate that in the laboratory it has been demonstrated that the application of a ceramic coating reduces the amount of coke formation on the inside of reactor tubes with or without using steam as a diluent.

Obviously, numerous modifications and variations of the present invention are possible in light of the above teachings. It is therefore to be understood that, within the scope of the appended claims, the invention may be practiced otherwise than as specifically described herein.

What is claimed as new and desired to be secured by Letters Patent of the United States is:

1. A method for passivating the inner surface of a metallic reactor tube which is used in steam or steamless hydrocarbon pyrolysis, comprising decomposing at 700° C.-900° C. a non-oxygen containing silicon containing precursor selected from the group consisting of hexamethyldisilazane, tetramethylsilane, (diethylamino)trimethylsilane, (isopropylamino)trimethylsilane, (dimethylamino)trimethylsilane, heptamethyldisilazane, bis(isopropylamino)dimethylsilane, hexamethyldisilane, tetramethyldisilazane, (diethylamino)triethylsilane, tetrakis(dimethylamino)silane, bis(dimethylamino)methylsilane, (dimethylamino)triethylsilane, trimethylsilane, (dimethylamino)benzyldimethylsilane, (dimethylamino)phenylmethylsilane, (2-picolylamino)trimethylsilane, tris(isopropylamino)methylsilane, dimethylsilane, bis(diethylamino)methylsilane, (dimethylamino)benzylmethylsilane, butylmethylphenylsilane, (diisopropylamino)methylchlorosilane, octamethyltrisilazane, bis(dimethylamino)phenylsilane, benzylmethylchlorosilane, triisopropylsilane, tris(dimethylamino)methylsilane, diethylmethylsilane, triethylsilane, bis(dimethylamino)ethylsilane, hexamethyltrisilazane, and (dimethylamino)dimethylsilane, in the vapor phase, in an inert or reducing gas atmosphere in said tube to form a thin layer of 1 to 20 μm of a ceramic material on a surface of said reactor tube.

2. The method according to claim 1, wherein said ceramic material consists essentially of silicon carbide, silicon nitride, silicon carbonitride or mixtures thereof, and said ceramic material contains 0 to 20 mol. % of oxygen and 0 to 30 mol. % of free carbon.

3. The method according to claim 1, wherein said silicon containing precursor is a silicon compound which is volatile at temperatures below those employed in the deposition process.

4. The method according to claim 1, wherein said silicon containing precursor is hexamethyldisilazane.

5. The method according to claim 1, wherein said silicon containing precursor is (dimethylamino)triethylsilane.

6. The method according to claim 1, wherein said silicon containing precursor is octamethyltrisilazane.

7. The method according to claim 1, wherein said silicon containing precursor is bis(dimethylamino)methylsilane.

8. The method according to claim 1, wherein said inert or reducing gas is selected from the group consisting of nitrogen, argon, helium, methane, ethylene, ethane, hydrogen and mixtures thereof.

9. The method according to claim 8, wherein said inert or reducing gas is nitrogen.

10. The method according to claim 8, wherein said inert or reducing gas is methane/hydrogen mixtures.

11. The method according to claim 8, wherein said inert or reducing gas is selected from the group consisting of methane, ethylene, hydrogen, ethan and mixtures thereof.

12. The method according to claim 1, wherein the concentration of said silicon containing precursor in said inert or reducing gas is less than 10.0 volume percent.

13. The method according to claim 12, wherein the concentration of said silicon containing precursor in said inert or reducing gas is less than 5.0 volume percent.

* * * * *